United States Patent [19]

Hatano et al.

[11] Patent Number: 5,709,757
[45] Date of Patent: Jan. 20, 1998

[54] FILM FORMING AND DRY CLEANING APPARATUS AND METHOD

[75] Inventors: Tatsuo Hatano, Nirasaki; Seishi Murakami, Kofu; Kunihiro Tada, Nirasaki, all of Japan

[73] Assignee: Tokyo Electron Limited, Tokyo, Japan

[21] Appl. No.: 518,980

[22] Filed: Aug. 24, 1995

[30] Foreign Application Priority Data

Aug. 25, 1994 [JP] Japan .................. 6-225494
Jan. 17, 1995 [JP] Japan .................. 7-023490

[51] Int. Cl.$^6$ .................................................. B08B 3/10
[52] U.S. Cl. ............... 134/22.14; 134/1.1; 134/21; 134/22.12; 134/22.19; 156/626.1; 156/643.1
[58] Field of Search ............ 134/1.1, 21, 22.14, 134/22.19, 22.12; 156/626.1, 643.1

[56] References Cited

U.S. PATENT DOCUMENTS

| | | | |
|---|---|---|---|
| 4,048,240 | 9/1977 | Connelly | 260/652 |
| 5,298,112 | 3/1994 | Hayasaka et al. | 156/643 |
| 5,486,235 | 1/1996 | Ye et al. | 134/1.1 |

*Primary Examiner*—Harold Y. Pyon
*Attorney, Agent, or Firm*—Oblon, Spivak, McClelland, Maier & Neustadt, P.C.

[57] ABSTRACT

A film forming apparatus having a dry cleaning function comprises a process chamber for containing an object to be processed, a process gas supply system for introducing into the process chamber a process gas for forming one of a metal film or a metal compound film on the object, a heating device for depositing a component of the process gas on the object, thereby forming a film, a cleaning gas supply system for introducing into the process chamber a cleaning gas containing nitrogen trichloride or a fluoride such as chlorine trifluoride or nitrogen trifluoride for cleaning one of a metal or a metal compound adhering to an inner part of the process chamber due to the film formation, and an after-treatment gas supply system for introducing into the process chamber a cleaning after-treatment gas containing an alcohol.

63 Claims, 5 Drawing Sheets

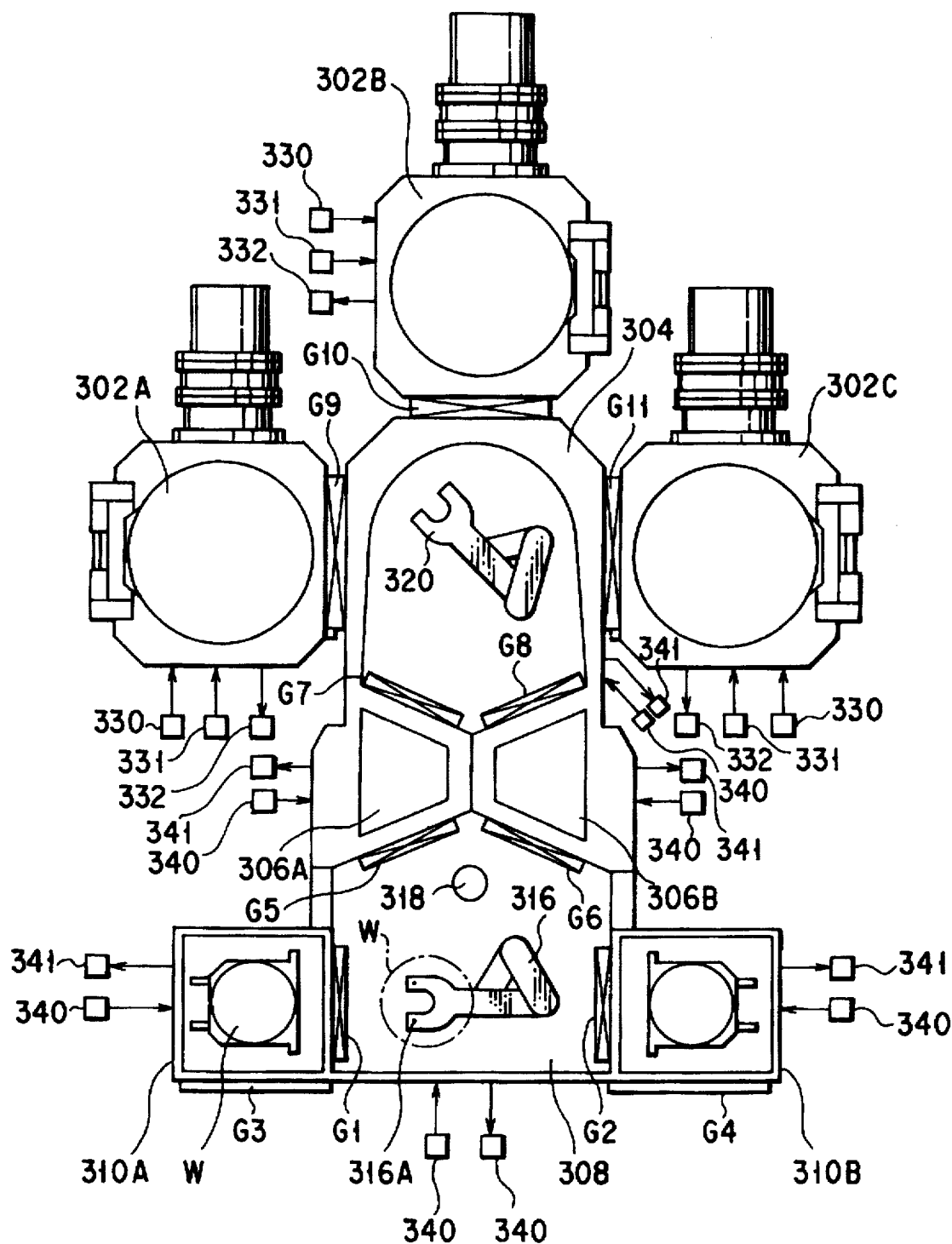
F I G. 4

FILM FORMING AND DRY CLEANING APPARATUS AND METHOD

BACKGROUND OF THE INVENTION

1. Field of the Invention

The present invention relates to a film forming and dry-cleaning apparatus such as a film forming apparatus for forming a metal film or a metal compound film on, for example, a semiconductor wafer, and a dry cleaning method for cleaning the process apparatus.

2. Description of the Related Art

In a conventional manufacturing process of a semiconductor wafer, a film of a metal or a compound thereof, for example, titanium or titanium nitride, is formed on the semiconductor wafer or an object to be processed, by using a process apparatus such as a low-pressure CVD apparatus. This layer is used, for example, as a wiring layer of a semiconductor device.

In the step of forming the metal or metal compound film, a semiconductor wafer or an object to be processed is placed on a table within a process chamber adjusted to have an atmosphere of a predetermined low pressure. The object to be processed is heated up to a predetermined temperature by a heating source provided within the table, and a process gas including the metal or metal compound is introduced from a process gas introducing port. Thus, the film is formed.

When the above film forming process is performed, the film of the metal or metal compound is coated not only on the object but also on the inner wall of the process chamber or other jigs. The film coated on the process chamber will be peeled at last and particles of the metal or metal compound will occur. These particles may fly and adhere to the object, and the yield of the object will decrease.

To prevent this problem from arising, the inside of the process chamber is washed at some frequency by means of wet washing with use of a cleaning solution such as an HF solution, or by means of dry cleaning with use of a cleaning gas such as $NF_3$ gas or $ClF_3$ gas.

In particular, a metal or a metal compound, for example, titanium or titanium nitride, has conventionally been washed by plasma cleaning using $NF_3$ gas or $Cl_2$ gas.

In the plasma cleaning, although good cleaning effects can be obtained in the plasma region in which active species are present, such good cleaning effects cannot be obtained in the other regions. In the case of a one-by-one type film forming apparatus, the plasma cleaning can be performed since the volume of the process chamber is small. However, in the case of a batch type film forming apparatus, the volume of the reaction chamber is large and it is difficult to perform uniform plasma cleaning on all the necessary parts.

On the other hand, a method of using $ClF_3$ has been known as a plasmaless dry cleaning method.

In this method, however, all the parts to be cleaned need to be heated. Thus, a heating means for cleaning must be provided in addition to a heating means for film formation. The structure of the apparatus becomes complex and some of the structural members may be damaged by heat.

When titanium or titanium nitride is cleaned with a cleaning gas of fluorine compound, for example, $NF_3$ or $ClF_3$, titanium fluoride ($TiF_4$) is produced by a reaction formula,

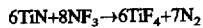

$$6TiN + 8NF_3 \rightarrow 6TiF_4 + 7N_2$$

Since the vapor pressure of the titanium fluoride is low, the titanium fluoride remains in the process chamber, resulting in contamination. It is necessary, therefore, to prevent the contamination.

SUMMARY OF THE INVENTION

An object of the present invention is to provide a process apparatus and a dry cleaning method for the process apparatus, wherein a process can be performed at room temperature, damage to the apparatus can be reduced to a minimum, and dry cleaning can be performed without producing a fluoride which results in contamination.

Another object of the invention is to provide a process apparatus and a dry cleaning method for the process apparatus, wherein even when a metal or a metal compound such as titanium or titanium nitride is cleaned with a fluorine-based gas such as $NF_3$ or $ClF_3$, a fluoride or a reaction product of the titanium or titanium nitride and the fluorine-based gas can easily be converted to another species at room temperature and be removed.

According to a first aspect of the present invention, there is provided a process apparatus comprising:

a process chamber for containing an object to be processed;

process gas introducing means for introducing into the process chamber a process gas for processing the object;

process means for processing the object; and cleaning gas introducing means for introducing into the process chamber a cleaning gas containing nitrogen trichloride ($NCl_3$) for cleaning one of a metal or a metal compound adhering to an inner part of the process chamber due to the process.

According to a second aspect of the invention, there is provided a process apparatus comprising:

a process chamber for containing an object to be processed;

process gas introducing means for introducing into the process chamber a process gas for forming one of a metal film or a metal compound film on the object;

film forming means for depositing a component of the process gas on the object, thereby forming a film; and cleaning gas introducing means for introducing into the process chamber a cleaning gas containing nitrogen trichloride ($NCl_3$) for cleaning one of a metal or a metal compound adhering to an inner part of the process chamber due to the process.

According to a third aspect of the invention, there is provided a process apparatus comprising:

a process chamber for containing an object to be processed;

process gas introducing means for introducing into the process chamber a process gas for processing the object;

process means for processing the object;

cleaning gas introducing means for introducing into the process chamber a cleaning gas containing fluorine for cleaning one of a metal or a metal compound adhering to an inner part of the process chamber due to the process; and after-treatment gas supply means for supplying a cleaning after-treatment gas containing an alcohol into the process chamber.

According to a fourth aspect of the invention, there is provided a process apparatus comprising:

a process chamber for containing an object to be processed;

process gas introducing means for introducing into the process chamber a process gas for forming a metal film or a metal compound film on the object; film forming means for depositing a component of the process gas on the object, thereby forming a film;

cleaning gas introducing means for introducing into the process chamber a cleaning gas containing a fluorine for cleaning a metal or a metal compound adhering to an inner part of the process chamber due to the process; and after-treatment gas supply means for supplying a cleaning after-treatment gas containing an alcohol into the process chamber.

According to a fifth aspect of the invention, there is provided a dry cleaning method for cleaning a process apparatus for processing an object contained in a process chamber, the method comprising the steps of:

introducing a cleaning gas containing nitrogen trichloride (NCl$_3$) into the process chamber after the processing; and reacting the cleaning gas with a metal or a metal compound adhering to an inner part of the process chamber due to the processing.

According to a sixth aspect of the invention, there is provided a dry cleaning method for cleaning a process apparatus for processing an object contained in a process chamber, the method comprising the steps of:

introducing a cleaning gas containing a fluorine into the process chamber after the processing;

reacting the cleaning gas with a metal or a metal compound adhering to an inner part of the process chamber due to the processing; and performing an after-treatment for supplying a cleaning after-treatment gas containing an alcohol into the process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a plan view schematically showing the structure of a multi-chamber type film forming process system according to a fourth embodiment of the invention.

DESCRIPTION OF THE PREFERRED EMBODIMENTS

Figure 1:
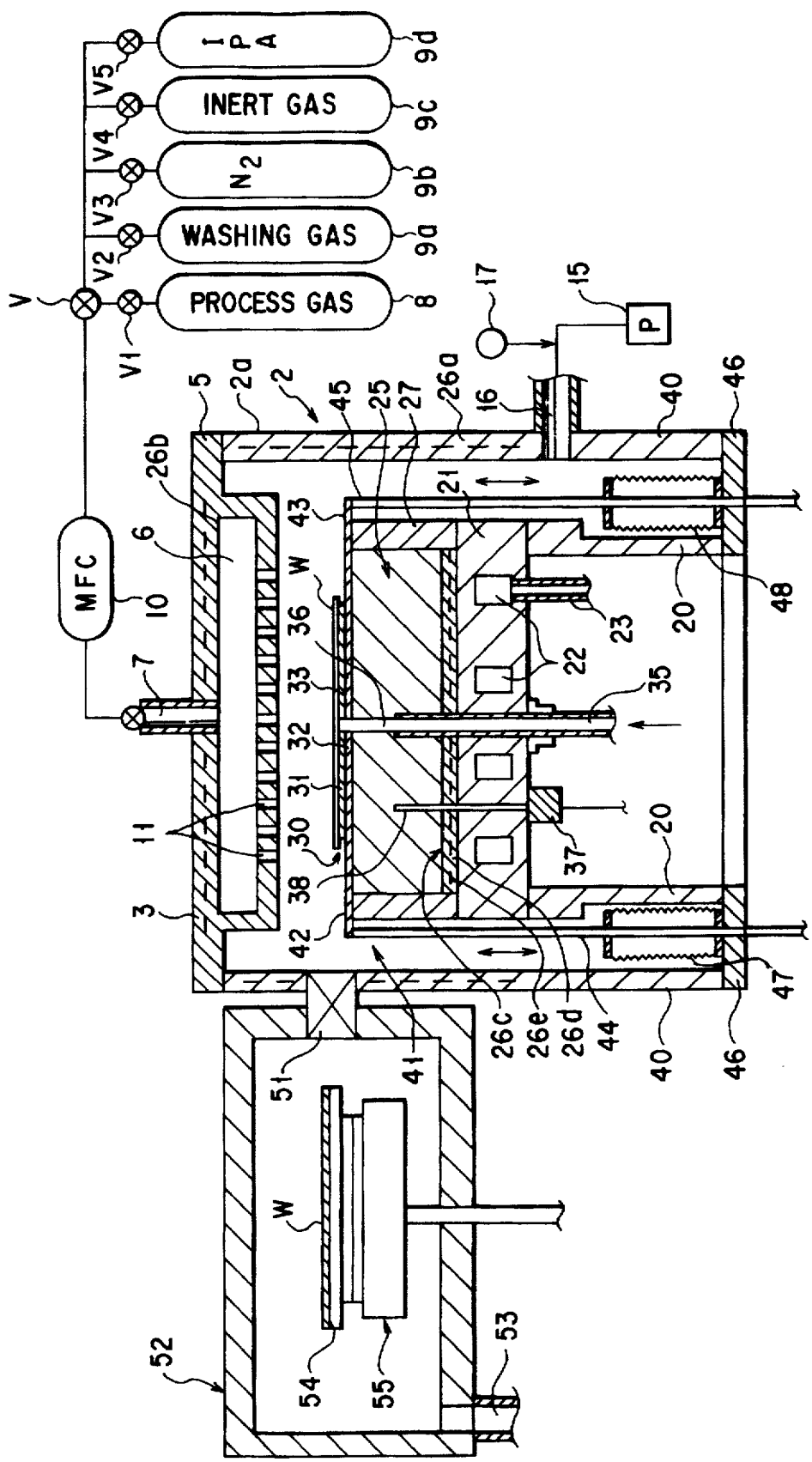
FIG. 1 is a cross-sectional view schematically showing the structure of a single wafer type resistance-heating CVD apparatus according to a first embodiment of the present invention.

When a metal film or a metal compound film of, for example, titanium or titanium nitride, is formed, this substance is coated on the inner wall of a process chamber or other jigs. In order to remove the coated substance, a cleaning gas containing chlorine trinitride is used in the present invention. In this case, a chloride is produced as a reaction product by a chemical reaction expressed by

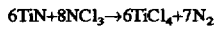
6TiN+8NCl$_3$→6TiCl$_4$+7N$_2$

Thus, a fluoride which causes contamination is not produced. In general, the boiling point of the chloride or reaction product is lower than that of a fluoride which is a reaction product produced when titanium or titanium nitride is processed with a fluorine-based cleaning gas. For example, the boiling point of TiF$_4$ is 284° C., whereas the boiling point of TiCl$_4$ or a reaction product produced when titanium or titanium nitride is processed with a cleaning gas containing nitrogen trichloride is 136.4° C. Since the TiCl$_4$ which is the reaction product produced in the case of the process using the nitrogen trichloride containing cleaning gas has a low boiling point and easily changes to a gas phase, the TiCl$_4$ does not deposit within the process chamber and can be removed.

The nitrogen trichloride has a high reactivity and a certain degree of hazardousness. However, nitrogen gas added to the nitrogen trichloride produces a reaction opposite to the equilibrium reaction using the cleaning gas is reversed, thereby curbing the reaction. In addition, the reactivity may be controlled by diluting the cleaning gas by adding thereto an inert gas, for example, helium (He), neon (Ne), argon (Ar), krypton (Kr), xenon (Xe) or radon (Rn).

The above cleaning gas is applicable not only to the titanium and titanium nitride, but also to such a metal or a compound thereof that the vapor pressure of a chloride of this metal or metal compound is higher than the vapor pressure of a fluoride of this metal or metal compound. For example, the cleaning gas is applicable to tungsten (W), tungsten nitride (W$_2$N, WN$_2$, W$_2$N$_3$), tantalum (Ta), tantalum nitride (TAN), and aluminum (Al).

The dry cleaning method in which no fluoride is produced has been described. However, even if a fluoride is produced, no problem arises if it can easily be converted to anther substance at room temperature and be removed. Accordingly, in another method of the present invention, a cleaning gas containing fluorine, for example, fluoride such as chlorine trifluoride (ClF$_3$) or nitrogen trifluoride (NF$_3$), is used and a fluoride or a reaction product, for example, TiF$_4$, is converted to another species by an after-treatment and removed.

When a fluoride is used as cleaning gas, a fluoride, for example, TiF$_4$ is produced as a reaction product of a chemical reaction expressed by

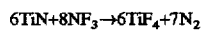
6TiN+8NF$_3$→6TiF$_4$+7N$_2$

The boiling point of the fluoride is high, as mentioned above. For example, the boiling point of TiF$_4$ is 284° C. Thus, the fluoride is difficult to vaporize. In this method, an alcohol, for example, isopropyl alcohol (IPA), is introduced into the process chamber in the after-treatment. Thereby, the fluoride as a reaction product can be converted to alkoxide having a higher vapor pressure.

For example, titanium tetrafluoride (TiF$_4$) having a boiling point of 284° C. is converted to tetraisopropoxy titanium (Ti(i-OC$_3$H$_7$)$_4$ having a boiling point of 58° C. by a chemical reaction expressed by

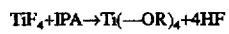
TiF$_4$+IPA→Ti(—OR)$_4$+4HF

Since the alkoxide obtained by the conversion has a high vapor pressure, it can be easily vaporized and exhausted to the outside of the process chamber.

As has been described above, even when the fluorine-based gas is used as cleaning gas, the reactivity may be controlled by diluting the cleaning gas or alcohols used in the after-treatment by adding thereto a nitrogen gas or an inert gas, for example, helium (He), neon (Ne), argon (Ar), krypton (Kr), xenon (Xe) or radon (Rn).

This cleaning gas is applicable not only to titanium or titanium nitride but also to another such metal or compound thereof that a reaction product of this metal or metal compound, produced after the cleaning using a fluorine-based gas, reacts with an alcohol in the after-treatment and converted to alkoxide having a higher vapor pressure than the reaction product. For example, this cleaning gas is applicable to tungsten (W), tungsten nitride ($W_2N$, $WN_2$, $W_2N_3$), tantalum (Ta), tantalum nitride (TaN), and aluminum (Al).

The alcohol is not limited to IPA, but may be another alcohols, in particular, lower alcohols such as methyl alcohol, ethyl alcohol and butyl alcohol.

In the case of using $NCl_3$ as cleaning gas, an alcohol may be added to the cleaning gas in the after-treatment. In this case, too, alkoxide is produced. Accordingly, when a chloride tending to easily deposit, for example, $WCl_6$, is produced, the chloride may be converted to alkoxide, as mentioned above. Thus, the alkoxide is easily vaporized and exhausted to the outside of the process chamber.

A preferred embodiment of the present invention as applied to a single wafer type CVD apparatus will now be described in detail with reference to the accompanying drawings.

[First Embodiment]

FIG. 1 is a cross-sectional view schematically showing the structure of a one-by-one type resistance-heating CVD apparatus according to a first embodiment of the present invention.

The CVD apparatus can be evacuated to a predetermined low pressure level. The CVD apparatus has a substantially cylindrical process chamber 2 for subjecting an object to be processed, for example, a semiconductor wafer W, to a film forming process. A side wall 2a of the process chamber 2 is formed of, for example, aluminum, and a heater 26a is embedded in the side wall 2a. Therefore, the side wall 2a can be heated from room temperature to a desired temperature, for example, 250° C., at the time of the film forming process or at the time of cleaning (described later).

A ceiling wall 3 of the process chamber 2 is openable upward by means of a hinge portion 5. A hollow cylindrical shower head 6 is hermetically provided at a central portion of the ceiling surface 3. A process gas supply pipe 7 is connected to an upper part of the shower head 6. A specified process gas, for example, a film forming process gas such as a mixture gas of titanium tetrachloride+an inert gas or a mixture gas of titanium tetrachloride+ammonia, is introduced from a process gas source 8 via a mass flow controller (MFC) 10 into the shower head 6 through the supply pipe 7. The mass flow controller (MFC) 10 is connected to gas sources used for cleaning, i.e. a cleaning gas source 9a, a nitrogen gas source 9b, an inert gas source 9c and an isopropyl alcohol (IPA) source 9d. At the time of dry cleaning, a predetermined cleaning gas can be introduced into the process chamber 2 by operating a valve V to switch the process gas source 8 to a cleaning gas source.

The flow rates of gases from the gas sources 8, 9a, 9b, 9c and 9d can be controlled by flow rate control valves $V_1$ to $V_5$.

The examples of the cleaning gas used in the present embodiment are:

(1) a cleaning gas containing nitrogen trichloride ($NCl_3$), and (2) a cleaning gas containing a fluoride, for example, chlorine trifluoride ($ClF_3$) or nitrogen trifluoride ($NF_3$).

Typical examples of the cleaning gas (1) are:

(a) a cleaning gas essentially consisting of nitrogen trichloride ($NCl_3$), (b) a cleaning gas essentially consisting of $NCl_3$ and nitrogen ($N_2$), and (c) a cleaning gas essentially consisting of $NCl_3$, $N_2$ and an inert gas.

The gas fed from the gas source 9a is $NCl_3$ in the case of the cleaning gases (a), (b) and (c) of cleaning gas (1), and is $ClF_3$ or $NF_3$ in the case of the cleaning gas (2). The gas source 9b is a nitrogen gas source and the gas source 9c is an inert gas source. These gas sources 9b and 9c are used in the case of using, for example, the cleaning gases (b) and (c). The IPA source 9d is used to introduce IPA into the process chamber 2 in an after-treatment, after the cleaning using the fluoride is completed, as described later.

Gas jet ports 11 are formed in a lower surface of the shower head 6, i.e. an opposed surface to a table 25 (described later). The process gas introduced into the shower head 6 from the process gas supply pipe 7 is uniformly discharged towards the table 25 within the process chamber 2 via the gas jet ports 11. A heating device 26b such as a heater is built in the shower head 6. Therefore, the shower head 6 can be heated up to a predetermined temperature, for example, 250° C., at the time of the film forming process or the cleaning process.

An exhaust pipe 16 communicating with an exhaust device 15 such as a vacuum pump is formed near a bottom portion of the process chamber 2. A particle counter 17 comprising, for example, a laser counter for counting the number of particles flying in an atmosphere exhausted from the process chamber 2 is provided midway along the exhaust pipe 16. The process chamber 2 is set at a reduced pressure level, for example, $10^{-6}$ Torr by the exhaust device 15. It is desirable that an oil-free dry pump be used as exhaust device 15. The reason for this is that since nitrogen trichloride is used as cleaning gas, the use of a regular vacuum pump using oil may possibly result in deterioration in quality of pump oil or damage to the pump body due to chlorine mixed in the oil.

The bottom portion of the process chamber 2 is constituted by a bottom plate 21 supported by a substantially cylindrical support member 20. A cooling water reservoir 22 is provided within the bottom plate 21. Cooling water supplied through a cooling water pipe 23 is circulated in the cooling water reservoir 22.

The table 25 is provided on the upper surface of the bottom plate 21 via a heating device 26c interposed. The peripheral portions of the heater 26c and table 25 are surrounded by a heat insulating wall 27. An object W to be processed, for example, a semiconductor wafer is placed on the table 25. The surface of the heat insulating wall 27 is mirror-finished so as to reflect radiation heat from the ambient. Thereby, heat insulation is effected.

The heater 26c comprises an insulator 26d and a strip-like heating element 26e embedded in the insulator 26d. The heating element 26e has a predetermined pattern, for example, a spiral pattern. A voltage is applied to the heating element 26e from an AC power supply (not shown) provided outside the process chamber 2. Thus, the heater 26c is heated up to a predetermined temperature, for example, 400° C. to 2000° C., and the object W on the table 25 can be kept at a predetermined temperature, for example, 800° C.

An electrostatic chuck 30 for attracting and holding the object W is provided on the upper surface of the table 25. The electrostatic chuck 30 comprises two insulating films 31 and 32 formed of a high polymer insulating material such as polyimide resin, and a conductive film 33 of, for example, copper film, interposed between the two insulating films 31 and 32. The object W is placed on the upper insulating film 31. The conductive film 33 is connected to a variable DC voltage source (not shown). A high voltage is applied to the conductive film 33 from the DC voltage source, so that the object W is attracted and held by coulomb force on the upper surface of the insulating film 31 of the electrostatic chuck.

A heat transmission medium supply pipe 35 penetrating the bottom plate 21 is inserted into a central portion of the table 25 having the above structure. A heat transmission medium, for example, He gas is supplied through a flow path connected to an end portion of the heat transmission medium supply pipe 35 to the bottom surface of the object W placed on the support surface of the electrostatic chuck 30.

A sensing portion 38 of a temperature sensor 37 is situated within the table 25. The sensing portion 38 senses successively the temperature within the table 25. The temperature sensor 37 is connected to a controller (not shown). On the basis of a sense signal from the temperature sensor 37, the controller controls the power, etc. of an AC power supply which is supplied to the heater 26. Thus, the temperature of the support surface of the table 25 is controlled at a desired value.

A lifter 41 for vertically moving the object W placed on the support surface of the table 25 is provided within a substantially annular space defined by the outer peripheral surface of the heat insulating wall 27, the outer peripheral surface of the bottom plate 21, the outer peripheral surface of the support member 20 and the inner peripheral surface of the side wall 40 of the process chamber 2.

An upper part of the lifter 41 comprises a pair of semicircular support members 42 and 43 matching with the radius of curvature of the peripheral portion of the disk-like object W, and support columns 44 and 45 vertically provided on the lower surfaces of the support members 42 and 43. The object W is supported on properly designed engaging portions provided on the inner peripheral portions of the support members 42 and 43. As is shown in FIG. 1, the lower part of the lifter 41 is constructed such that the lower end portions of the support columns 44 and 45 vertically movably penetrate an annular support plate 46. The support plate 46 hermetically seals the bottom of the above-mentioned substantially annular space defined by the outer peripheral surface of the heat insulating wall 12, etc. The lower end portions of the support columns 44 and 45 are connected to a vertical movement mechanism (not shown) such as a motor. The lower end portions of the support columns 44 and 45 are reciprocally moved by the vertical movement mechanism in a vertical direction as indicated by an arrow in FIG. 1. Bellows 47 and 48 are provided at the locations within the process chamber 2 where the support columns 44 and 45 penetrate the support plate 46. The sealing of the process chamber 2 is ensured by the bellows 47 and 48.

The process chamber 2 having the above structure is connected via a valve 51 to a hermetically sealed load lock chamber 52. The load lock chamber 52 is evacuated through an exhaust pipe 53 provided at the bottom of the chamber 52. Like the process chamber 2, the load lock chamber 52 can be set and kept at a reduced pressure level, for example, $10^{-6}$ Torr.

The load lock chamber 52 houses a transfer device 55 having a transfer arm 54 for transferring the object W between a cassette provided within a cassette storage chamber (not shown), situated adjacent to the load lock chamber 52 via a gate valve, and the table 25 provided within the process chamber 2.

The operation of the film forming apparatus with the above structure in the film forming process will now be described.

At the time the reduced pressure level in the process chamber 2 has become equal to that in the load lock chamber 52, the gate valve 51 is opened and the object W on which a film is to be formed is transferred to a point above the table 25 within the process chamber 2 by means of the transfer arm 54 of the transfer device 55.

At this time, the support members 42 and 43 of the lifter 41 are raised and the object W is placed on the engaging portions provided at the inner peripheral portions of the support members 42 and 43. Then, the transfer arm 54 is retreated into the load lock chamber 52 and the gate valve 51 is closed.

Thereafter, the support members 42 and 43 of the lifter 41 are lowered and the object W is placed on the support surface of the electrostatic chuck 30 of the table 25. A DC voltage from the high voltage DC power supply (not shown) is applied to the conductive film 33. Thus, the object W is attracted and held on the support surface of the chuck 30 by coulomb force produced by the application of the voltage.

Subsequently, power is supplied from the AC power supply (not shown) to the heating element of the heater 26c and the object W is heated up to a predetermined temperature, for example, 800° C. In addition, the process gas, for example, a mixture gas of titanium tetrachloride+an insert gas or a mixture gas of titanium tetrachloride+ammonia, is introduced into the process chamber 2 from the process gas supply pipe 7. Thus, the process of film formation on the object W is started.

When the film formation process is performed on the surface of the object W, a reaction product adheres not only to the object W but also to a member within the process chamber 2, in particular, a peripheral surface of the shower head 6 influenced by radiation heat from the table 25. Under the circumstances, in order to continue a stable supply of products, cleaning needs to be carried out at a certain point in time to remove the reaction product.

To achieve this, one of the following first and second cleaning methods is performed.

(1) First Dry Cleaning Method

Dry cleaning is performed by using a cleaning gas containing nitrogen trichloride ($NCl_3$). Three typical examples of the cleaning gas used in the first dry cleaning method are:

(a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

When the first dry cleaning method is performed, the valve v is switched and one of the cleaning gases (a) to (c) is introduced into the process chamber 2 which has been evacuated by the exhaust device 15 to a reduced pressure level of 0.01 Torr to 100 Torr, preferably about 0.1 Torr to 1 Torr.

According to the first dry cleaning method, a chloride having a higher vapor pressure, and accordingly a lower boiling point, than a fluoride produced by cleaning using a fluorine-based gas is produced as a reaction product. The chloride does not adhere to the inner wall of the process chamber and is easily vaporized and vacuum-exhausted. Thus, occurrence of particles can be prevented.

Since sufficient effects can be obtained at room temperature with the $NCl_3$-containing cleaning gas, there is no need to heat the part to be cleaned, unlike the prior art. However, needless to say, the parts to be cleaned, for example, the shower head 6 and side wall 2a of the process chamber 2, may be heated, if necessary, up to a proper temperature by means of the heaters 26a, 26b and 26c, thereby to shorten the cleaning time.

If the cleaning gas essentially consisting of $NCl_3$ alone is used, sufficient cleaning effects can be obtained. However, since nitrogen trichloride ($NCl_3$) has a high reactivity and a certain degree of hazardousness, it is desirable to dilute the $NCl_3$ gas in actual use by adding thereto nitrogen gas and/or inert gas, like the aforementioned gases (b) and (c). Thereby, damage to the apparatus can be prevented. For example, if $NCl_3$ gas supplied at a flow rate of 10 sccm is mixed with 10 to 100 times the amount of nitrogen gas or insert gas, the reaction can be curbed and damage to the apparatus may be prevented. In the first cleaning method, it should suffice if the cleaning gas contains $NCl_3$. Therefore, gases other than nitrogen gas and inert gas may be contained in the cleaning gas, unless the cleaning function is deteriorated.

(2) Second Dry Cleaning Method

In the second dry cleaning method, dry cleaning is first performed by using a cleaning gas containing chlorine trifluoride ($ClF_3$) or nitrogen trifluoride ($NF_3$). At the time of performing the second dry cleaning method, the valve V is switched and a predetermined cleaning gas is introduced at a flow rate of, for example, 10 to 500 sccm into the process chamber 2 which has been evacuated to a reduced pressure level of, for example, about 0.1 Torr to 10 Torr.

Since sufficient effects can be obtained at room temperature with the cleaning gas used in the second cleaning method, there is no need to heat the part to be cleaned, unlike the prior art. However, needless to say, the parts to be cleaned, for example, the shower head 6 and side wall 2a of the process chamber 2, may be heated, if necessary, up to a proper temperature, for example, 50° to 250° C. by means of the heaters 26a, 26b and 26c, thereby to shorten the cleaning time.

In order to control the reaction rate of the highly reactive fluoride gas such as $ClF_3$ or $NF_3$ at the time of cleaning, the cleaning gas may be diluted with nitrogen gas or an inert gas. Thereby, damage to the apparatus can be prevented. Besides, other gases may be added to the cleaning gas unless the cleaning function is deteriorated.

When the dry cleaning is performed by using the cleaning gas containing chlorine trifluoride ($ClF_3$) or nitrogen fluoride ($NF_3$), as described above, a fluoride such as $TiF_4$ is produced. In this case, the fluoride ($TiF_4$) is produced as a reaction product of a chemical reaction expressed by $$6TiN + 8NF_3 \rightarrow 6TiF_4 + 7N_2$$

Since the boiling point of the $TiF_4$ is 284° C., as mentioned above, the $TiF_4$ is difficult to vaporize. If it adheres to, for example, the side wall 2a of process chamber 2, particles may occur.

To solve this problem in the second cleaning method, an alcohol, for example, isopropyl alcohol, is introduced in an after-treatment of the dry cleaning at a flow rate of, for example, 10 to 200 sccm into the process chamber 2 which has been evacuated by the exhaust device 15 to a reduced pressure level of, for example, about 0.1 Torr to 10 Torr. As a result, the fluoride is converted to alkoxide having a high vapor pressure. For example, $TiF_4$, the boiling point of which is 284° C., is converted to tetraisopropoxy titanium ($Ti(i-OC_3H_7)_4$), the boiling point of which is 58° C., by a chemical reaction expressed by $$TiF_4 + IPA \rightarrow Ti(-OR)_4 + 4HF$$

In the second cleaning method, as described above, the fluoride which has been regarded as a cause of particles in the conventional dry cleaning method, is converted to alkoxide. The alkoxide can easily be vaporized and exhausted to the outside of the process chamber.

It is desirable to perform a purge process prior to the introduction of an alcohol such as IPA, by introducing nitrogen gas or an inert gas into the process chamber 2.

Since the chemical reaction with the alcohol occurs at room temperature, there is no need to heat the part to be cleaned, at the time of reaction. However, needless to say, the parts to be cleaned, for example, the shower head 6 and side wall 2a of the process chamber 2, may be heated, if necessary, up to a proper temperature, for example, 50° to 120° C. by means of the heaters 26a, 26b and 26c, thereby to shorten the cleaning time. If the temperature is raised while introducing IPA, the fluoride can be more effectively converted to $Ti(-OR)_4$.

When the IPA is introduced, the cleaning gas may be diluted with nitrogen gas or an inert gas in order to control the reaction rate.

After the predetermined dry cleaning method has been completed, the process chamber is evacuated and a film forming process can be performed once again.

The time at which to wash the deposit by the above dry cleaning is determined, for example, in the following manner.

(i) The number of particles adhering to the non-processed object W to be transferred into the process chamber 2 and the number of particles adhering to the processed object transferred out of the process chamber 2 are counted and if the difference in number reaches a predetermined value, the cleaning is carried out.

(ii) The number of particles flying in the atmosphere exhausted from the process chamber 2 via the exhaust pipe 16 is counted by the particle counter 17 and if the number of particles in the exhausted atmosphere reaches a predetermined value, the cleaning is carried out.

(iii) After a predetermined number of objects W have been processed in the process chamber 2, the cleaning is carried out.

The deposit is removed by the above-described dry cleaning, following which a film forming process is continued.

According to the first dry cleaning method, a chloride having a higher vapor pressure than a fluoride produced in the conventional cleaning process using a fluorine-based gas is produced. Thus, the vaporization of the reaction product is facilitated even at room temperature and the reaction product can be exhausted. Therefore, such an undesirable situation is prevented from arising, that the reaction product deposits in the process chamber once again and produces particles.

According to the second dry cleaning method, a fluoride produced in the process chamber by the dry cleaning using the fluorine-based gas is converted to alkoxide having a low boiling point by adding an alcohol such as IPA to the fluoride. Thus, the vaporization of the reaction product is facilitated even at room temperature and the reaction product can be exhausted. Therefore, such an undesirable situation is prevented from arising, that the reaction product deposits in the process chamber once again and produces particles.

In the case of the first cleaning method, too, IPA can be supplied from the IPA source 9d in the after-treatment. In this case, too, alkoxide can be produced and the reaction product can easily be vaporized and exhausted.

According to the first and second dry cleaning methods, the contamination of the object W by particles can be prevented, the downtime of the apparatus decreased, and the operation rate increased.

The embodiment of the cleaning method of the present invention, which is applied to the one-by-one type resistance-heating CVD apparatus 1 shown in FIG. 1, has been described. The present invention is applicable not only to the resistance-heating CVD apparatus but also to a one-by-one type lamp-heating CVD apparatus as described below.

[Second Embodiment]

Figure 2:
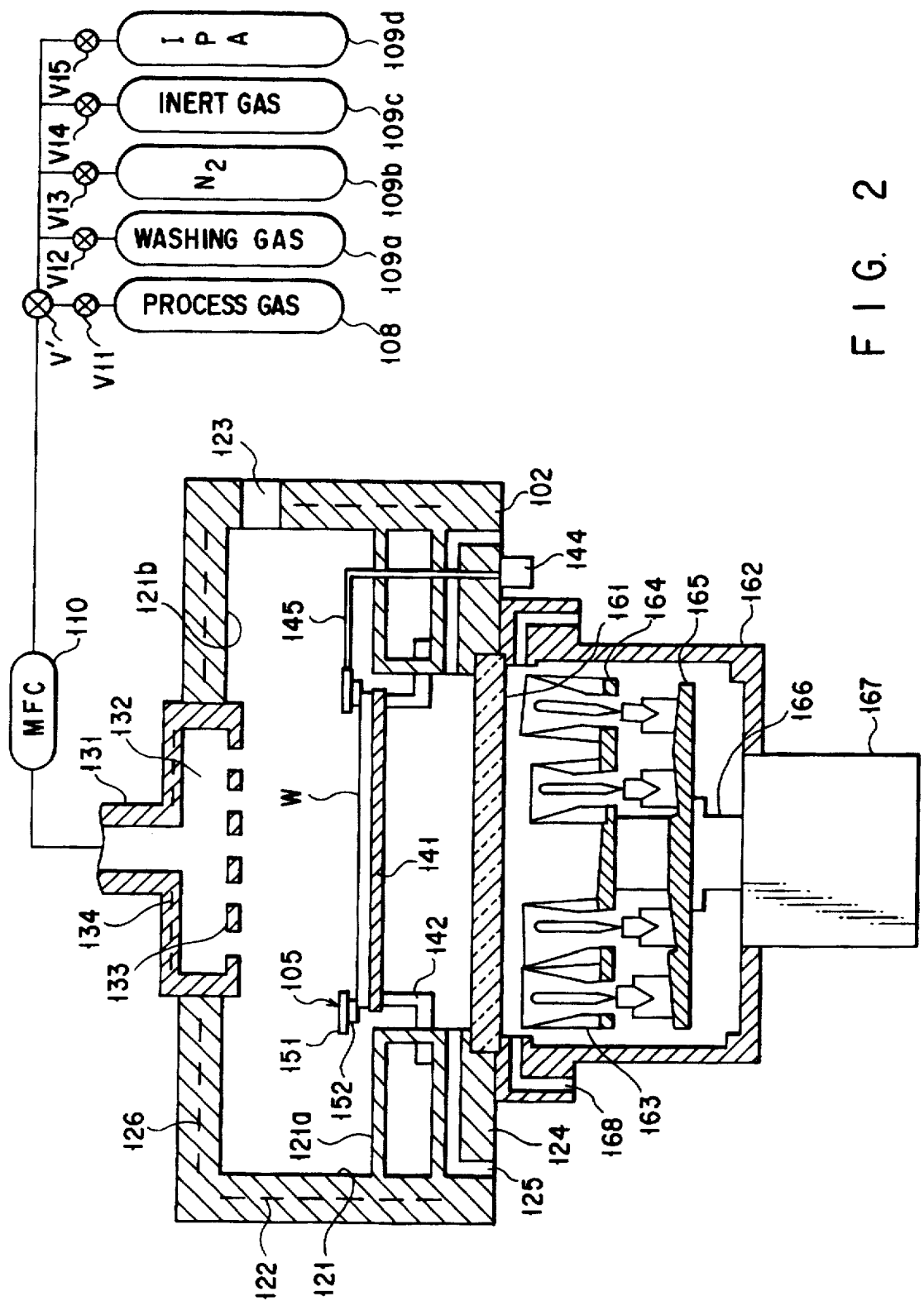
FIG. 2 is a cross-sectional view schematically showing the structure of a one-by-one type lamp-heating CVD apparatus according to a second embodiment of the invention.

A second embodiment of the present invention as applied to a lamp-heating CVD apparatus will now be described with reference to FIG. 2.

The lamp-heating CVD apparatus has a hermetically constructed process chamber 102 for subjecting an object to be processed, for example, a wafer W, to a film forming process. A process gas supply pipe 131 is connected to a top portion of the process chamber 102. The process gas supply pipe 131 is connected via a mass flow controller (MFC) 110 and a valve V' to a film forming process gas source 108, a dry cleaning gas source 109a, a nitrogen gas source 109b, an inert gas source 109c and an IPA gas source 109d. Thus, a predetermined gas can be supplied in accordance with the type of process, for example, film formation or cleaning.

The flow rates of the gases from the gas sources 108, 109a, 109b, 109c and 109d can be controlled by flow rate control valves $V_{11}$ to $V_{15}$.

For example, a mixture gas of titanium tetrachloride+an inert gas or a mixture gas of titanium tetrachloride+ammonia can be used as a process gas for forming a titanium film or a titanium nitride film on a to-be-processed surface of, an object, for example, a wafer W.

A gas introducing chamber 132 is provided on a lower end side of the process gas supply pipe 131. A diffusing plate 133 for supplying the process gas into the process chamber 102 in a shower-like manner is provided on the lower side of the gas introducing chamber 132.

Heating means 134 such as heater is provided within a wall of the gas introducing chamber 132. Thereby, the gas introducing chamber 132 can be heated up to a predetermined temperature, for example, 50° C. to 120° C., at the time of film formation or dry cleaning, as will be described later.

A table 141 for supporting the wafer W is provided below the gas introducing chamber 132 within the process chamber 102. The table 141 is disposed on a side wall 121 of the process chamber 102 with a table support frame 142 interposed therebetween. A ring member 105 for covering a peripheral portion of the surface (on which a thin film is to be formed) of the wafer W placed on the table 141 is provided within the process chamber 102. The ring member 105 is attached to a vertical movement mechanism 144 so as to approach and move away from the surface of the wafer W, for example, between a position where the ring member 105 covers the surface of the wafer and a higher position.

The ring member 105 comprises an annular hold ring portion 151 formed so as to cover the entire peripheral portion of the wafer, and a contact portion 152 provided on the bottom surface of the hold ring portion 151.

A part of a side wall 121 of the process chamber 102 is formed as a projecting portion 121a projecting to the inside of the process chamber 102 so as to surround the table 141 and the region below the table 141. The distance between an upper end of an inner peripheral portion of the projecting portion 121a and a lower end of an outer peripheral portion of the ring member 105 is set at, for example, 0.5 to 3 mm when the wafer W is set on the table 141 and the peripheral portion of the wafer surface is covered by the ring member 105. The gap between the projecting portion 121a of the side wall 121 and the ring member 105 constitutes a purge gas path (described later).

Heaters 122 and 126 are provided within the side wall 121 and top wall 121b of the process chamber 102, respectively. Thus, the walls 121 and 121b of the process chamber 102 can be heated up to a predetermined temperature, for example, 50° to 120° C. at the time of dry cleaning (described later).

A purge gas supply path 125 for supplying a purge gas consisting of nitrogen gas towards the bottom surface of the wafer, i.e. the table 141 is provided between the bottom wall 124 of the process chamber 102 and the projecting portion 121a of the side wall 121.

A transmissive window 161 formed of, for example, quartz is attached to the bottom of the process chamber 102. A heating chamber 162 is provided on the bottom side of the process chamber 102 with the transmissive window 161 interposed. In the heating chamber 162, a plurality of heating lamps 163 for heating the wafer are fixed at predetermined positions on upper and lower rotational plates 164 and 165. The two rotational plates 164 and 165 are coupled to a rotating mechanism 167 by means of a rotational shaft 166. A side portion of the heating chamber 162 is provided with a cooling air introducing port 168 for introducing cooling air, thereby to prevent the heating of the inside of the process chamber 102 and the transmissive window 161.

Although not shown, this lamp-heating CVD apparatus is connected via a valve to a hermetically sealed load lock chamber situated near the CVD apparatus.

A description will now be given of the film forming process using the one-by-one type lamp heating CVD apparatus having the above structure and the dry washing process performed within the process chamber.

In the film forming process, a wafer as an object to be processed is transferred onto the table 141 via a transfer inlet/output (not shown) by a transfer arm (not shown). The ring member 105 is then lowered by the vertical movement mechanism 144, thereby holding the peripheral portion of the surface of the wafer.

Then the heating lamps 163 are turned on to heat the wafer up to, for example, 350° to 500° C. While the process chamber 102 is being evacuated by a vacuum pump (not shown) via the exhaust port 123, a predetermined process gas, for example, a mixture gas of titanium tetrachloride+an inert gas or a mixture gas of titanium tetrachloride+ammonia, is supplied into the process chamber 102 from the gas introducing chamber 132 via the process gas supply pipe 131 at a flow rate of 10 to 200 sccm, and the process chamber 102 is maintained at a predetermined pressure. The process gas is decomposed by heat of the wafer and titanium, for example, is produced. Thus, a titanium film or a titanium nitride film is deposited on the surface of the wafer.

After the film forming process of forming the film on the wafer is completed, the ring member 105 is moved upward from the wafer by means of the vertical movement mechanism 144 and separated from the peripheral portion of the surface of the wafer. The processed wafer is transferred by the transfer arm (not shown) to the outside of the process chamber 102 via the transfer inlet/outlet (not shown).

Suppose that the film forming process has been repeatedly performed and the number of particles detected by a particle counter (not shown) has reached a predetermined value. Consequently, titanium or titanium nitride adheres to the parts within the process chamber other than the object, for example, the inner walls 121, 121a and 121b of the process chamber 102 and/or the transmissive window 161 formed of quartz, and particles are produced from the adhering titanium or titanium nitride. In addition, the transmissive window 161 becomes opaque and the heating efficiency deteriorates. In this case, the first dry cleaning process or the second dry cleaning process is performed according to the present invention.

In this embodiment, like the first embodiment, one of the following first and second dry cleaning methods is carried out.

(1) First Dry Cleaning Method

Dry cleaning is performed by using a cleaning gas containing nitrogen trichloride ($NCl_3$). Three typical examples of the cleaning gas used in the first dry cleaning method are:

(a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

When the first dry cleaning method is performed, one of the cleaning gases (a) to (c) is introduced into the process chamber 102 which has been evacuated to a reduced pressure level of 0.01 Torr to 100 Torr, preferably about 0.1 Torr to 1 Torr.

In this embodiment, the first dry cleaning is performed, as in the first embodiment. Like the first embodiment, a chloride with a low boiling point is produced as a reaction product. The reaction product does not adhere to the inner wall, etc. of the process chamber and vaporizes easily. Therefore, the reaction product is vacuum-exhausted and the occurrence of particles is prevented.

(2) Second Dry Cleaning Method

In the second dry cleaning method, dry cleaning is first performed by using a cleaning gas containing chlorine trifluoride ($ClF_3$) or nitrogen trifluoride ($NF_3$). At the time of performing the second dry cleaning method, the cleaning gas is introduced at a flow rate of, for example, 10 to 500 sccm into the process chamber 102 which has been evacuated to a reduced pressure level of, for example, about 0.1 Torr to 10 Torr.

Like the first embodiment, a fluoride ($TiF_4$) having a high boiling point and being difficult to vaporize is produced as a reaction product. However, as described in connection with the first embodiment, an alcohol, for example, isopropyl alcohol, is introduced in an after-treatment of the dry cleaning at a flow rate of, for example, 10 to 200 sccm into the process chamber 102 which has been evacuated to a reduced pressure level of, for example, about 0.1 Torr to 10 Torr. As a result, the fluoride is converted to alkoxide having a high vapor pressure.

In the second cleaning method, as described above, the fluoride which has been regarded as a cause of particles in the conventional dry cleaning method, is converted to alkoxide. The alkoxide can easily be vaporized and exhausted to the outside of the process chamber.

Besides, it is desirable to perform a purge process by introducing nitrogen gas or an inert gas into the process chamber 102, prior to the introduction of the alcohol such as IPA.

The first or second dry cleaning is performed, as described above, thereby removing the deposit and continuing the film forming process.

According to the first dry cleaning method, like the first embodiment, the chloride having a higher vapor pressure is produced. Thus, the vaporization of the reaction product is facilitated even at room temperature and the reaction product can be exhausted. Therefore, such an undesirable situation is prevented from arising, that the reaction product deposits in the process chamber once again and produces particles.

According to the second dry cleaning method, like the first embodiment, a fluoride produced in the process chamber by the dry cleaning using the fluorine-based gas is converted to alkoxide having a low boiling point by adding an alcohol such as IPA to the fluoride. Thus, the vaporization of the reaction product is facilitated even at room temperature and the reaction can be exhausted. Therefore, such an undesirable situation is prevented from arising, that the reaction product deposits in the process chamber once again and produces particles.

As has been described above in connection with the first embodiment, since sufficient effects can be obtained at room temperature with the first and second cleaning methods, there is no need to heat the part to be cleaned, unlike the prior art. However, needless to say, the parts to be cleaned, for example, the gas introducing chamber 132, inner walls 121, 121a and 121b of the process chamber 102, or transmissive window 161, may be heated, if necessary, up to a proper temperature, for example, 50° to 250° C. by means of the heaters 122, 126 and 134 or heating lamps 163, thereby to shorten the cleaning time.

Since nitrogen trichloride ($NCl_3$), chlorine trifluoride ($ClF_3$) and nitrogen trifluoride ($NF_3$) used as cleaning gas have a high reactivity and a certain degree of hazardoushess, it is possible to dilute the cleaning gas by adding thereto nitrogen gas and/or inert gas, thereby curbing the reaction. Furthermore, needless to say, it is possible to curb the reaction of the cleaning gas by diluting the alcohol such as IPA used in the after-treatment of the second cleaning method with nitrogen gas and/or an inert gas. Moreover, like the first embodiment, an alcohol such as IPA can be used in the after-treatment of the first cleaning method.

In the above embodiments, the invention has been applied to the one-by-one type resistant-heating CVD apparatus and one-by-one type lamp-heating CVD apparatus. The invention, however, is applicable to a batch-type CVD apparatus will be described below. Since it is difficult to perform plasma cleaning in the batch-type CVD apparatus, the invention can advantageously be applied to this type of CVD apparatus.

[Third Embodiment]

An embodiment of the present invention as applied to a batch-type CVD apparatus will now be described with reference to FIG. 3.

Figure 3:
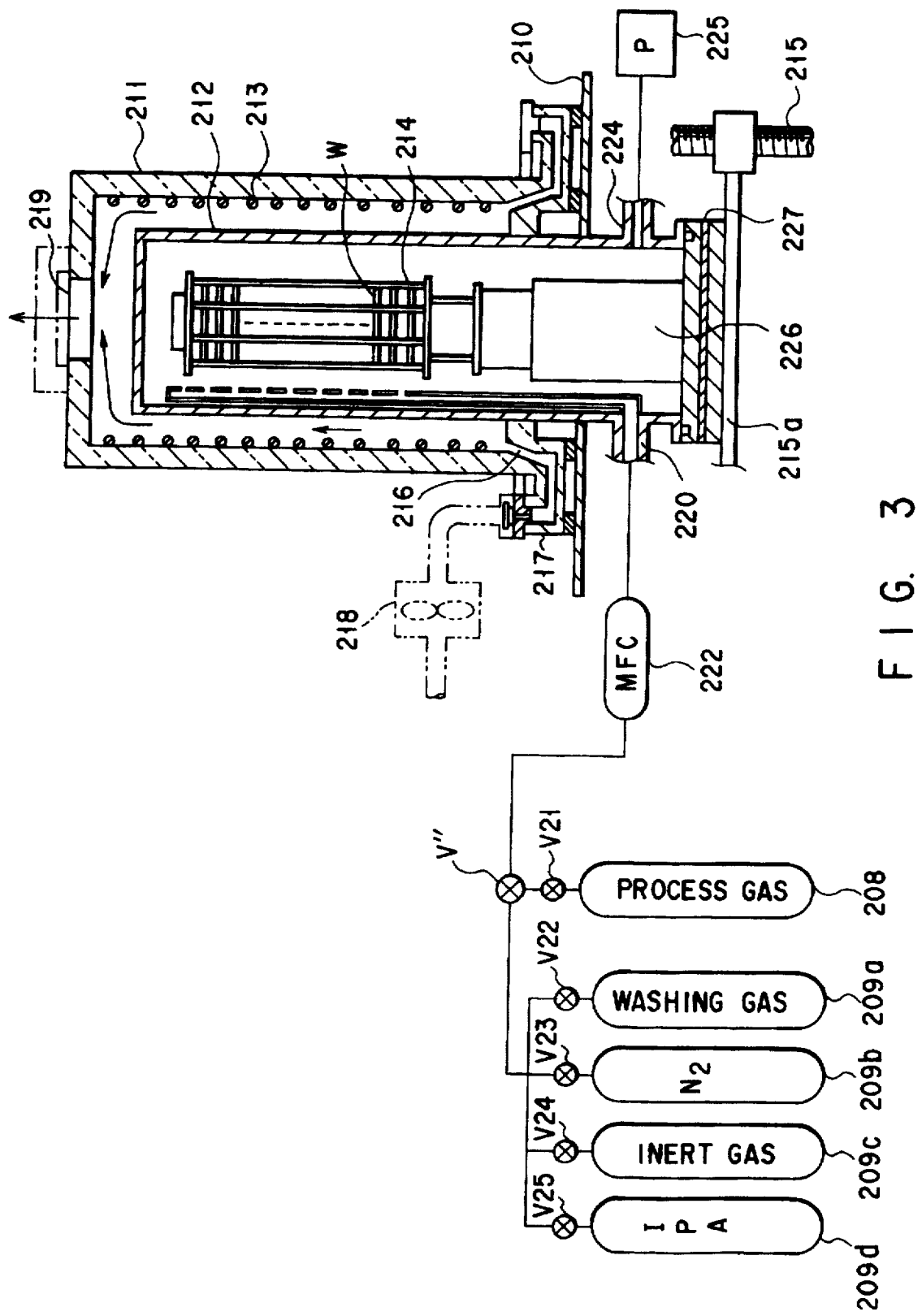
FIG. 3 is a cross-sectional view schematically showing the structure of a batch-type CVD apparatus according to a third embodiment of the invention.

FIG. 3 is a cross-sectional view showing a high-speed vertical heat treatment furnace used as a low-pressure CVD apparatus. This vertical heat treatment furnace comprises a horizontal base 210, a substantially cylindrical heat-insulating furnace body 211 provided with a closed top portion and supported vertically on the base 210, a reaction tube 212 inserted in the furnace body 211 with a predetermined gap between the tube 212 and the inner wall of the furnace body 211, and a heater 213 formed of a resistance heating element embedded spirally in the furnace body 211 so as to surround the reaction tube 212. The reaction tube 212 has a substantially cylindrical shape with a closed top portion and is formed of, for example, quartz or fused silica.

A wafer boat 214 holding a number of objects, for example, semiconductor wafers arranged vertically, with the surface of each wafer being situated horizontally, is loaded into the reaction tube 212 of the vertical furnace from the lower opening. The wafer boat 214 is placed on a table 215a coupled to a vertical movement mechanism 215, with a cover member 227 and a heat insulating 226 interposed. When the wafer boat 214 is loaded in the reaction tube 212, the table 215a is raised by the vertical movement mechanism, and the lower opening of the reaction tube 212 is hermetically sealed by the cover member 227. When the wafer boat 214 is unloaded, the wafer boat 214 within the reaction tube 212 is lowered by the vertical movement mechanism 215.

A bottom part of the furnace body 211 is provided with an air inlet 216 communicating with a gap between the furnace body 211 and reaction tube 212. An air supply fan 218 is connected to the air inlet 216 via a manifold 217. Cooling air can be supplied to the gap by the fan 218. A top portion of the furnace body 211 is provided with an air exhaust port 219 communicating with the aforementioned gap, thereby to exhaust the air in the gap.

A gas introducing pipe 220 is connected to a bottom portion of the reaction tube 212. A predetermined process gas, for example, a film forming process gas such as a mixture gas of titanium tetrachloride+an inert gas or a mixture gas of titanium tetrachloride+ammonia, is introduced into the reaction tube 212 from a process gas source 208 via a mass flow controller (MFC) 222. The mass flow controller (MFC) 222 is also connected to gas sources used for cleaning, i.e. a cleaning gas source 209a, a nitrogen gas source 209b, an inert gas source 209c and an IPA source 209d. The flow rates of the gases from the gas sources 208, 209a, 209b, 209c and 209d can be controlled by flow rate control valves $V_{21}$ to $V_{25}$. At the time of dry cleaning, a valve V" is switched to introduce a predetermined cleaning gas, mentioned below, into the reaction tube 212: (1) A cleaning gas containing nitrogen trichloride ($NCl_3$), or (2) A cleaning gas containing a fluoride such as chlorine trifluoride ($ClF_3$) or nitrogen trifluoride ($NF_3$).

Three typical examples of the cleaning gas (1) are:

(a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

The IPA source 209d is used to introduce IPA into the reaction tube 212 in an after-treatment after the cleaning with the fluoride.

The gas introduced into the reaction tube 212 through the gas introducing pipe 220 is exhausted to the outside of the reaction tube 212 by a vacuum pump 225 via an exhaust pipe 224 provided at a lower end portion of the reaction tube 212.

It is desirable to use an oil-free dry pump as vacuum pump 225, because of the same reason as mentioned in connection with the first embodiment.

A description will now be given of the film forming process using the vertical heat treatment furnace having the above structure and the dry washing process performed within the reaction tube.

In the film forming process, the wafer boat 214 storing a number of objects, for example, 8-inch semiconductor wafers W, is loaded in the reaction tube 212 heated up to a predetermined temperature for processing, for example, 400° C. The reaction tube 212 is then sealed by the cover 227. After the reaction tube 212 is evacuated to a pressure level of, for example, about 0.5 Torr, the process gas, for example, a mixture gas of $TiCl_4+NH_3$, is supplied from the gas introducing pipe 220 at a predetermined flow rate, thereby performing film formation on the semiconductor wafers W. After the film forming process is completed, the process gas within the reaction tube 212 is exhausted. Specifically, while the process gas within the reaction tube 212 is being exhausted, the inert gas such as $N_2$ gas is introduced. Thus, the atmosphere within the reaction tube 212 is replaced with an $N_2$ gas atmosphere. In this manner, the process gas within the reaction tube 212 is removed and a non-detrimental atmosphere is created within the reaction tube 212 at room temperature. Subsequently, the wafer boat 214 is unloaded from the reaction tube 212, and a series of film forming steps is completed. Then, the film forming process for the next lot of semiconductor wafers is performed.

Suppose that the film forming process has been repeatedly performed and it has been determined, for example, by means of a particle counter (not shown) that titanium or titanium nitride adheres to the parts within the reaction tube 212 other than the objects, in particular, parts formed of quartz, and particles may be produced from the adhering titanium or titanium nitride. In this case, the dry cleaning process using a predetermined cleaning gas is performed according to the present invention.

In this embodiment, like the first embodiment, one of the following first and second dry cleaning methods is carried out.

(1) First Dry Cleaning Method

Dry cleaning is performed by using a cleaning gas containing nitrogen trichloride ($NCl_3$). Three typical examples of the cleaning gas used in the first dry cleaning method are:

(a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

At the time of performing the first dry cleaning method, the reaction tube 212 is sealed by the cover member 227 and one of the cleaning gases (a) to (c) is introduced via the gas introducing pipe 220 into the reaction tube 212 which has been evacuated to a reduced pressure level of about 0.01 Torr to 100 Torr, preferably about 0.1 Torr to 1 Torr.

In this embodiment, the first dry cleaning is performed, as in the first embodiment. Like the first embodiment, a chloride with a low boiling point is produced as a reaction product. The reaction product does not adhere to the inner wall, etc. of the reaction tube and vaporizes easily. Therefore, the reaction product is vacuum-exhausted and the occurrence of particles is prevented.

(2) Second Dry Cleaning Method

In the second dry cleaning method, dry cleaning is first performed by using a cleaning gas containing chlorine trifluoride ($ClF_3$) or nitrogen trifluoride ($NF_3$). At the time of performing the second dry cleaning method, the reaction tube 212 is sealed by the cover member 227 and the cleaning gas is introduced via the gas introducing pipe 220, at a flow rate of, for example, 10 to 500 sccm, into the reaction tube 212 which has been evacuated to a reduced pressure level of, for example, about 0.1 Torr to 10 Torr.

Like the first embodiment, a fluoride ($TiF_4$) having a high boiling point and being difficult to vaporize is produced as a reaction product. However, as described in connection with the first embodiment, an alcohol, for example, isopropyl alcohol, is introduced in an after-treatment of the dry cleaning at a flow rate of, for example, 10 to 200 sccm into the reaction tube 212 which has been evacuated to a reduced pressure level of, for example, about 0.1 Torr to 10 Torr. As a result, the fluoride is converted to alkoxide having a high vapor pressure.

In the second cleaning method, as described above, the fluoride which has been regarded as a cause of particles in the conventional dry cleaning method, is converted to alkoxide. The alkoxide can easily be vaporized and exhausted to the outside of the reaction tube.

The dry cleaning is performed, as described above, thereby removing the deposit and continuing the film forming process.

According to the first dry cleaning method, like the first embodiment, the chloride having a higher vapor pressure is produced. Thus, the vaporization of the reaction product is facilitated even at room temperature and the reaction product can be exhausted. Therefore, such an undesirable situation is prevented from arising, that the reaction product deposits in the process chamber once again. Therefore, contamination of the objects W due to particles can be prevented. In addition, the downtime of the apparatus is reduced and the operation rate increased.

According to the second dry cleaning method, a fluoride produced in the reaction tube by the dry cleaning using the fluorine-based gas is converted to alkoxide having a low boiling point by adding an alcohol such as IPA to the fluoride. Thus, the vaporization of the reaction product is facilitated even at room temperature and the reaction product can be exhausted. Therefore, such an undesirable situation is prevented from arising, that the reaction product deposits in the process chamber once again and produces particles.

Since sufficient effects can be obtained at room temperature in the first or second cleaning method using the cleaning gas or in the process of supplying IPA in the after-treatment of the second dry cleaning method, there is no need to heat the part to be cleaned, unlike the prior art. However, needless to say, the parts to be cleaned may be heated, if necessary, up to a proper temperature, for example, 50° to 250° C. by means of the heater 213, thereby to shorten the cleaning time.

Since nitrogen trichloride ($NCl_3$), chlorine trifluoride ($ClF_3$) and nitrogen trifluoride ($NF_3$) used as cleaning gas have a high reactivity and a certain degree of hazardousness, it is possible to dilute the cleaning gas by adding thereto nitrogen gas and/or inert gas, thereby curbing the reaction. Furthermore, needless to say, it is possible to curb the reaction by diluting the alcohol such as IPA used in the after-treatment of the second cleaning method with nitrogen gas and/or an inert gas. Moreover, like the first and second embodiments, an alcohol such as IPA can be used in the after-treatment of the first cleaning method.

In the above embodiments, the invention has been applied to the single wafer type CVD apparatus and batch-type CVD apparatus. The invention, however, is also applicable to a so-called multi-chamber type vacuum apparatus comprising a plurality of vacuum process apparatuses.

[Fourth Embodiment]

Figure 5:
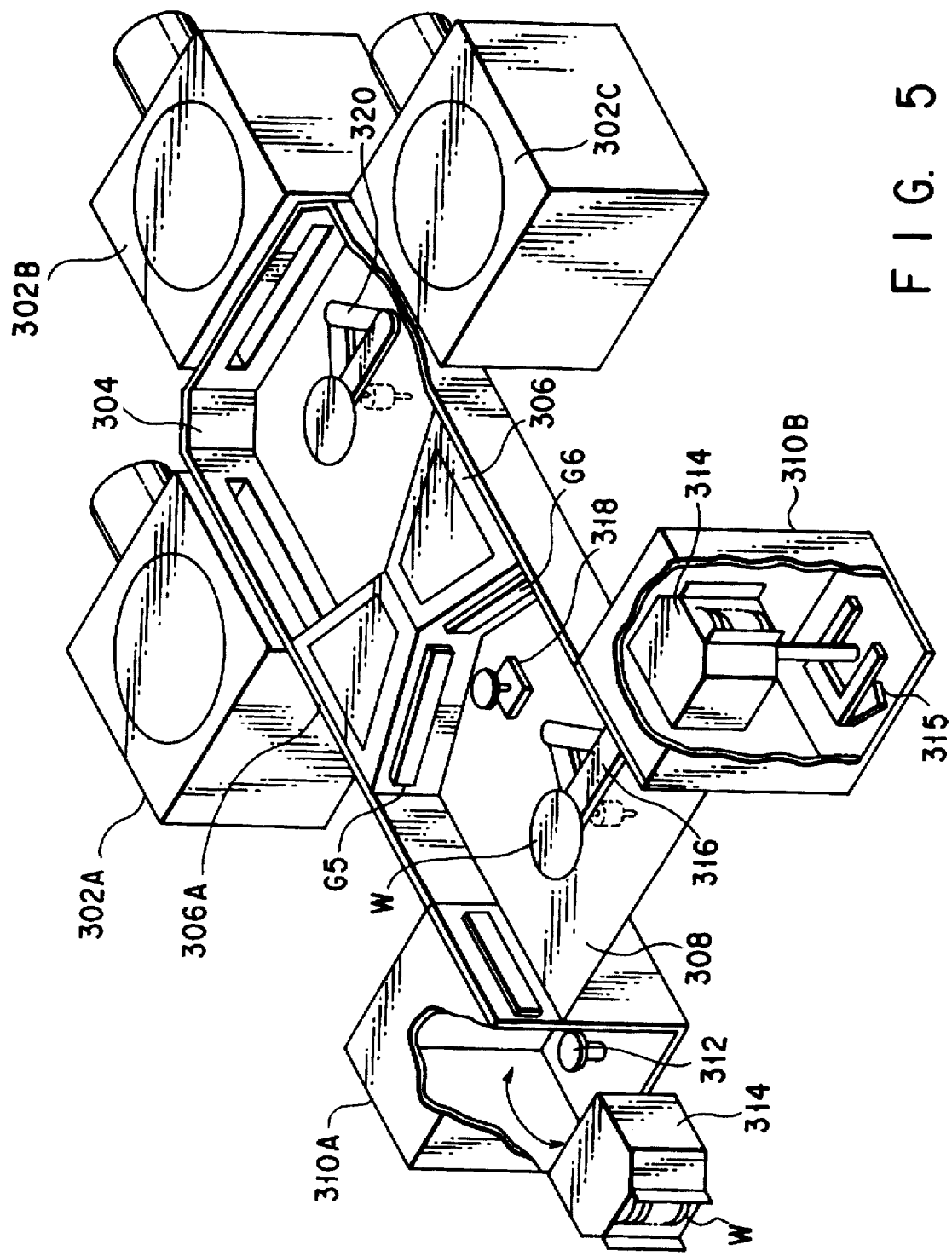
FIG. 5 is a partially cut-out perspective view of the apparatus shown in FIG. 4.

An embodiment of the present invention as applied to a multi-chamber type or a cluster type vacuum processing system will now be described with reference to FIGS. 4 and 5.

The vacuum processing system comprises a first vacuum process apparatus 302A, a second vacuum process apparatus 302B, a third vacuum process apparatus 302C and a common transfer chamber (a second transfer chamber) 304 connected to these vacuum process apparatuses. In addition, the vacuum processing system comprises first and second auxiliary vacuum chambers 306A and 306B connected to the second transfer chamber 304, a first transfer chamber 308 connected to the auxiliary vacuum chambers 306A and 306B, and first and second cassette chambers 310A and 310B connected to the first transfer chamber 308. Thus, a so-called "cluster tool" type multi-chamber vacuum processing system is constituted.

The vacuum process apparatuses 302A, 302B and 302C are an assembly of apparatuses to be used in successively processing the surfaces of objects to be processed, i.e. semiconductor wafers. The first vacuum process apparatus 302A, for example, is designed to form a titanium layer or a titanium nitride layer on a fine pattern by CVD. The second process apparatus 302B, for example, is designed to form a titanium film on a wafer with a fine pattern by sputtering at 400° to 500° C. The third vacuum process apparatus 302C is designed to etch back a titanium layer or a titanium nitride layer. The number and type of these process apparatuses are not limited.

The first transfer chamber 308 is connected on both sides to the first and second cassette chambers 310A and 310B via gate valves G1 and G2. The cassette chambers 310A and 310B constitute wafer carry-in/out ports of the process apparatus assembly. Each cassette chamber has a vertically movable cassette stage 312 (see FIG. 5).

Each of the first transfer chamber 308 and cassette chambers 310A and 310B has a hermetically sealed structure. The cassette chambers 310A and 310B have gate valves G3 and G4 which are opened to communicate with the outside working room. Each of the cassette chambers 310A and 310B is provided with a carry-in/out robot 315 having a rectangular holding member with one side opened (see FIG. 5). As is shown in FIG. 5, the carry-in/out robot 315 carries a wafer cassette 314 (facing the front side) into the cassette chamber 310A (310B) such that the cassette 314 faces the lateral side. After the wafer cassette 314 has been carried into the cassette chamber 310A (310B), the wafer cassette 314 is raised by the cassette stage 312 up to a predetermined level.

The first transfer chamber 308 comprises first transfer means, for example, a first articulated arm 316, and a rotational stage 318 for aligning the center and orientation flat of the semiconductor wafer W or the object to be processed. The rotational stage 318 and a light emission unit and a light reception unit (not shown) constitute an aligning mechanism.

The first transfer arm 316 transfers the wafer W between the cassette in the cassette chamber 310A (310B) and the auxiliary vacuum chamber 306A (306B). Both side portions of a distal end portion of the arm, which functions as wafer holding portion, have suction ports 316A for vacuum-sucking the wafer W. The suction ports 316A are connected to a vacuum pump via a passage (not shown).

The first and second auxiliary vacuum chambers 306A and 306B are connected to the rear side of the first transfer chamber 308 via gate valves G5 and G6. The first and second auxiliary vacuum chambers 306A and 306B have the same structure. Each of the auxiliary vacuum chambers 306A and 306B comprises a wafer support member (not shown), a heating mechanism (not shown) for heating the wafer W supported on the wafer support member, and a cooling mechanism (not shown) for cooling the wafer W. The wafer W is heated and cooled by these members on an as-needed basis.

The second transfer chamber 304 is connected to the rear side of the first and second auxiliary vacuum chambers 306A and 306B via gate valves G7 and G8.

The second transfer chamber 304 comprises second transfer means, for example, a second articulated transfer arm 320 for transferring the wafer W between the first and second auxiliary vacuum chamber 306A and 306B and the first to third vacuum process apparatuses 302A to 302C.

The second transfer chamber 304 is connected on the right, left and rear sides to the three vacuum process apparatuses 302A to 302C via gate valves G9 to G11.

The structure of the vacuum process apparatus will now be described with reference to, for example, the first vacuum process apparatus 302A.

As has been described above, the first vacuum process apparatus 302A is designed to form, for example, a titanium layer or a titanium nitride film as a metal film or a metal nitride film by CVD. The first vacuum process apparatus 302A is, for example, a lamp-heating CVD apparatus as shown in FIG. 2. A description of the details of the apparatus is omitted since the apparatus has already been described with reference to FIG. 2.

The first vacuum process apparatus 302A is connected separately to a process gas supply system 330 for supplying a process gas, as shown in FIG. 4, and a cleaning gas supply system 331 for supplying a predetermined cleaning gas and other gases necessary for cleaning. The first vacuum process apparatus 302A is also connected to a vacuum exhaust system 332 for evacuating the process apparatus 302A.

In this embodiment, the gas supplied from the cleaning gas supply system 331 into the process apparatus 302A is, for example: (1) A cleaning gas containing nitrogen trichloride ($NCl_3$), or (2) A cleaning gas containing a fluoride such as chlorine trifluoride ($ClF_3$) or nitrogen trifluoride ($NF_3$).

Three typical examples of the cleaning gas (1) are: (a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

In the case of the cleaning gas (2), an after-treatment process gas containing an alcohol, for example, isopropyl alcohol (IPA), is supplied after the cleaning process.

As will be described above, at the time of the film formation, a predetermined gas is supplied from the process gas supply system 330 into the process apparatus 302A. At the time of cleaning, a cleaning gas chosen from the above cleaning gases according to the selected one of the first and second cleaning methods is supplied from the cleaning gas supply method 331 into the process apparatus 302A.

As is shown in FIG. 4, the other vacuum process apparatuses 302B and 302C have substantially the same structure as the first vacuum process apparatus 302A, and are connected independently to the process gas supply system 330 and cleaning gas supply system 331. In addition, each of the vacuum process apparatuses 302B and 302C is connected to the vacuum exhaust system 332 for evacuating the process apparatus 302B (302C) to a predetermined pressure level.

When the cleaning process is performed, not only the vacuum process apparatuses 302A to 302C but also the entire system including the first and second transfer chambers 308 and 304, first and second auxiliary vacuum chambers 306A and 306B and first and second cassette chambers 310A and 310B, are cleaned entirely or individually. Thus, each chamber is connected to a cleaning gas supply system 340 and a vacuum exhaust system 341 having the same structures as those of the cleaning gas supply system 331 and a vacuum exhaust system 332 connected first vacuum process apparatus 302A. Although not shown, each chamber is connected to a gas supply pipe for supplying an inert gas.

Heaters (not shown) are embedded in the walls defining each chamber and the first and second transfer arms 316 and 320 within the first and second transfer chambers 308 and 304. Thereby, the parts to be cleaned can be heated up to a predetermined temperature, for example, 50° C. to 120° C. at the time of cleaning.

A description will now be given of the film forming process by the processing system with the above structure and the first and second dry cleaning processes.

The cassette 314 storing, for example, 25 wafers W is transferred onto the cassette stage 312 within the cassette chamber 310A by the carry in/out robot 315. Then, the gate valve G3 is closed and an inert gas atmosphere is created within the cassette chamber 310A.

Subsequently, the gate valve G1 is opened and the wafer W in the cassette 314 is vacuum-sucked on the arm of the first transfer means 316. The wafer W is transferred into the first transfer chamber 308 which is filled with an inert gas atmosphere in advance. The orientation flat alignment and center alignment of the wafer W are performed by the rotational stage 318.

The aligned wafer W is transferred into the first auxiliary vacuum chamber 306A which is filled in advance with an inert gas atmosphere at atmospheric pressure. Then, the gate valve G5 is closed and the vacuum chamber 306A is evacuated to a pressure level of, for example, $10^{-3}$ to $10^{-6}$ Torr. At the same time, the wafer W is preheated up to about 500° C. in a time period of 30 to 60 seconds. The subsequently transferred non-processed wafer W is put in the second auxiliary vacuum chamber 306B similarly, and is preheated.

The gate valve G7 is opened and the preheated wafer W is held and taken out by the second transfer arm 320 of the second transfer chamber 304 which is evacuated in advance to a vacuum level of about $10^{-7}$ to $10^{-3}$ Torr. The preheated wafer W is then loaded in one of the vacuum process apparatuses 302A, 302B and 302C which are evacuated in advance to a predetermined reduced pressure level for performing desired processes.

The processed wafer W, which has been subjected to the series of process steps, is held by the second transfer arm 320 and transferred from, for example, the vacuum process apparatus 302A into the empty first auxiliary vacuum chamber 306A. The processed wafer W is cooled to a predetermined temperature within the vacuum chamber 306A and stored in the wafer cassette 314 within the second cassette chamber 310B in a manner reverse to the above-described.

The preheated wafer W is subjected to a film forming process, an etching process, etc. successively in a properly pre-programmed order. For example, in the first vacuum process apparatus 302A, a titanium film or a titanium nitride film is formed. Then, in the third vacuum process apparatus 302C, the titanium film or titanium nitride film is etched back. Following this, in the second vacuum process apparatus 302B, a titanium film is formed. Thus, the entire process is completed.

When the series of process steps have been repeated for a predetermined number of wafers W or over a predetermined time period, films adhere to the inside parts of each process apparatus, resulting in production of particles. Besides, when the processed wafers W are transferred in the transfer route, formed films may separate and fly in the form of particles or deposit on the bottom part of each chamber. In order to remove such a deposit or particles, the first or second dry cleaning process, as described in connection with the above embodiments, is performed.

The dry cleaning process may be performed for the entire processing system at a time, or separately for a specific vacuum process apparatus or a specific chamber in the transfer route.

The process of separately cleaning each vacuum process apparatus is substantially the same as the process already described in connection with the first to third embodiments shown in FIGS. 1 to 3. Thus, the process of cleaning the entire processing system at a time will now be described.

After the film forming process is completed, the valves of the process gas supply systems 330 of the vacuum process apparatuses 302A to 302C have been closed and the supply of the process gases to the associated process apparatuses is stopped.

If the gate valves for hermetically sealing the chambers are opened in this state, an undesirable gas stream occurs within the respective chamber due to a difference in pressure among the chambers. As a result, particles may fly. To avoid this situation, an inert gas such as nitrogen gas is supplied to the chambers individually while the gate valves are closed, that is, while the sealed states of the chambers are maintained.

When the pressures within the respective chambers are equalized by the nitrogen atmosphere, for example, at the atmospheric pressure level, the gate valves G1, G2 and G5 to G11 partitioning the respective chambers are opened and all the process apparatuses are made to communicate with one another. Thus, a single closed space is created. In this case, the gate valves G3 and G4 of the cassette chambers 310A and 310B are closed and the inside space of the system is not open to the outside atmosphere.

Then, the cleaning gas associated with the selected dry cleaning method is supplied to all the process apparatuses and the entire processing system is cleaned. In this case, the cleaning gas is supplied from the vacuum process apparatuses 302A to 302C to the entire processing system and exhausted to the outside from the vacuum exhaust systems 341 of the downstream-side cassette chambers 310A and 310B. At the same time, the vacuum exhaust systems 332 connected to the vacuum process apparatuses 302A to 302C are activated so that the cleaning gas may reach every part of each process apparatus.

In addition, the heaters provided in the walls, etc. of the vacuum process apparatuses 302A to 302C, transfer chambers 304 and 308, auxiliary vacuum chambers 306A and 306B and cassette chambers 310A and 310B may be activated to heat the parts to be cleaned up to a desired temperature, for example, 50° C. to 120° C. Thus, the cleaning efficiency can be enhanced.

In this embodiment, too, the above-described first or second dry cleaning method is performed.

(1) First Dry Cleaning Method

Dry cleaning is performed by using a cleaning gas containing nitrogen trichloride ($NCl_3$). Three typical examples of the cleaning gas used in the first dry cleaning method are:

(a) a cleaning gas essentially consisting of $NCl_3$, (b) a cleaning gas essentially consisting of $NCl_3$ and nitrogen ($N_2$), and (c) a cleaning gas essentially consisting of $NCl_3$, $N_2$ and an inert gas.

At the time of performing the first dry cleaning method, the communicating space within the processing system having the above structure is set at a reduced pressure level of about 0.01 Torr to 100 Torr, preferably about 0.1 Torr to 1 Torr, and the cleaning gas is introduced into the respective vacuum process chambers 302A to 302C.

In the vacuum process chambers 302A to 302C, the films adhering to the inner walls, jigs, shower head, transmissive window, etc. are let to react with the cleaning gas. As a result, a chloride with a low boiling point is produced as a reaction product. Thus, the reaction product does not adhere to the inner wall, etc. of the reaction tube and vaporizes easily. Therefore, the reaction product is vacuum-exhausted and the occurrence of particles is prevented.

The gases, which have cleaned the vacuum process chambers 302A to 302C, join in the second transfer chamber 304 via the gate valves G9 to G11. Part of the gases is exhausted from the vacuum exhaust system 332 connected to each process apparatus.

Then, the cleaning gas, which has joined in the second transfer chamber 304, flows to the first and second auxiliary vacuum chambers 306A and 306B via the gate valves G7 and G8 and further flows to the first transfer chamber 308 via the gate valves G5 and G6. Subsequently, the cleaning gas is branched into the first and second cassette chambers 310A and 310B via the gate valves G1 and G2. At last, the cleaning gas is exhausted from the vacuum exhaust system 341 of each cassette chamber.

(2) Second Dry Cleaning Method

Unlike the first dry cleaning method, in the second dry cleaning method, dry cleaning is first performed by using a cleaning gas containing chlorine trifluoride ($ClF_3$) or nitrogen trifluoride ($NF_3$). At the time of performing the second dry cleaning method, the communicating space within the processing system having the above structure is set at a reduced pressure level of about 0.01 Torr to 100 Torr, preferably about 0.1 Torr to 1 Torr, and the cleaning gas is introduced into the respective vacuum process chambers 302A to 302C. Like the first dry cleaning method, the cleaning gas is supplied to the respective chambers in the order of second transfer chamber 304, first and second auxiliary vacuum chambers 306A and 306B, first transfer chamber 308 and first and second cassette chambers 310A and 310B. At last, the cleaning gas is exhausted from the vacuum exhaust system 341 of each cassette chamber.

Like the preceding embodiments, when the dry cleaning is performed with the cleaning gas containing chlorine trifluoride ($ClF_3$) or nitrogen trifluoride ($NF_3$), a fluoride ($TiF_4$) having a high boiling point and being difficult to vaporize is produced as a reaction product.

After the cleaning process is completed, the fluoride is removed. It is desirable, in this case, to perform a purging process prior to the removal of the fluoride by introducing nitrogen gas or an inert gas into the communicating space by substantially the same procedure as that for supplying the fluorine-based dry cleaning gas.

Subsequently, an alcohol, for example, IPA, is introduced at a flow rate of, for example, 10 to 200 sccm into the vacuum process apparatuses 302A to 302C which have been evacuated to a reduced pressure level of, for example, about 0.1 Torr to 10 Torr. Then, the IPA is let to flow to the respective chambers in the order of second transfer chamber 304, first and second auxiliary vacuum chambers 306A and 306B, first transfer chamber 308 and first and second cassette chambers 310A and 310B. At last, the IPA is exhausted from the vacuum exhaust system 341 of each cassette chamber.

As a result, $TiF_4$ with a boiling point of 284° C., which is present in the processing system, is converted to tetraisopropoxy titanium ($Ti(i-OC_3H_7)_4$) having a boiling point of 58° C. The tetraisopropoxy titanium can be easily vaporized and exhausted to the outside of the processing system.

In the present embodiment, the dry cleaning is performed, as described above, thereby removing the deposit and continuing the film forming process.

According to the first dry cleaning method, the chloride having a higher vapor pressure is produced. Thus, the vaporization of the reaction product is facilitated even at room temperature and the reaction product can be exhausted. Therefore, such an undesirable situation is prevented from arising, that the reaction product deposits in the process chamber once again. Therefore, the same advantage as in the preceding embodiments can be obtained.

According to the second dry cleaning method, a fluoride produced in the process apparatuses by the dry cleaning using the fluorine-based gas is converted to alkoxide having a low boiling point by adding an alcohol such as IPA to the fluoride. Thus, the vaporization of the reaction product is facilitated even at room temperature and the reaction product can be exhausted. Therefore, such an undesirable situation is prevented from arising, that the reaction product deposits in the process chamber once again and produces particles.

In the above embodiments, the invention is applied to the one-by-one type CVD apparatus, batch-type CVD apparatus and multi-chamber type vacuum process apparatus assembly. However, needless to say, this invention is also applicable to various semiconductor process apparatuses such as an etching apparatus, an ashing apparatus and sputtering apparatus.

In the above embodiments, the invention is applied to the vacuum process apparatuses. However, needless to say, this invention is also applicable to normal-pressure process apparatuses.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dry cleaning apparatus, comprising:
   a process chamber for containing a substrate to be processed;
   process gas introducing means for introducing into said process chamber a process gas for processing said substrate;
   means for processing said substrate;
   cleaning gas introducing means for introducing into said process chamber a cleaning gas containing nitrogen trichloride;
   means for heating an inner part of said process chamber to a temperature of from room temperature to 250° C., so that the cleaning gas introduced into the process chamber cleans at least one of a metal and a metal compound adhering to the inner part of said process chamber due to said process;
   after-treatment gas supply means for supplying a cleaning after-treatment gas containing an alcohol into said process chamber; and
   means for discharging the cleaning gas, the cleaning after-treatment gas and a reaction product of the cleaning gas and for cleaning the after-treatment gas.

2. The apparatus according to claim 1 wherein said process chamber includes a peripheral wall having said inner part, in which said heating means is provided.

3. The apparatus according to claim 1 which further including means for reducing pressure in the process chamber to 0.1 to 10 Torr while the after-treatment gas is supplied into the process chamber.

4. A film-forming gas apparatus, comprising:
   a process chamber for containing a substrate to be processed;
   process gas introducing means for introducing into said process chamber a process gas for forming one of a metal film and a metal compound film on said substrate;
   film forming means for depositing a component of said process gas on said substrate, thereby forming a film;
   cleaning gas introducing means for introducing into said process chamber a cleaning gas containing nitrogen trichloride;
   means for heating an inner part of said process chamber to a temperature of from room temperature to 250° C., so that the cleaning gas introduced into the process chamber cleans at least one of a metal and a metal compound adhering to the inner part of said process chamber due to said process;
   after-treatment gas supply means for supplying a cleaning after-treatment gas containing an alcohol into said process chamber; and
   means for discharging the cleaning gas, the cleaning after-treatment gas and a reaction product of the cleaning gas and for cleaning the after-treatment gas.

5. The apparatus according to claim 4, wherein said film forming means processes a plurality of said substrates one by one.

6. The apparatus according to claim 4, wherein said film forming means processes a plurality of said substrates in a batch manner.

7. The apparatus according to claim 4, wherein said film forming means includes heating means.

8. The apparatus according to claim 7, wherein said heating means includes a resistance exothermic element.

9. The apparatus according to claim 7, wherein said heating means includes a heating lamp.

10. The apparatus according to claim 4, wherein said cleaning gas introducing means includes a nitrogen trichloride gas source.

11. The apparatus according to claim 10, wherein said cleaning gas introducing means includes a nitrogen gas source for introducing nitrogen gas into said process chamber.

12. The apparatus according to claims 11, wherein said cleaning gas introducing means includes an inert gas source for introducing an inert gas into said process chamber.

13. A dry cleaning apparatus comprising:
a process chamber for containing a substrate to be processed;
process gas introducing means for introducing into said process chamber a process gas for processing said substrate;
process means for processing said substrate;
cleaning gas introducing means for introducing into said process chamber a cleaning gas containing fluorine;
means for heating an inner part of said process chamber to a temperature of from room temperature to 250° C., so that the cleaning gas introduced into the process chamber cleans at least one of a metal and a metal compound adhering to the inner part of said process chamber due to said process;
after treatment gas supply means for supplying a cleaning after-treatment gas containing an alcohol into said process chamber and
means for discharging the cleaning gas, the cleaning after-treatment gas and a reaction product of the cleaning gas and for cleaning the after-treatment gas.

14. The apparatus according to claim 13, wherein said cleaning gas contains one of chlorine trifluoride and nitrogen trifluoride.

15. A film forming apparatus comprising: a process chamber for containing a substrate to be processed;
process gas introducing means for introducing into said process chamber a process gas for forming one of a metal film and a metal compound film on said substrate;
film forming means for depositing a component of said process gas on said substrate, thereby forming a film;
cleaning gas introducing means for introducing into said process chamber a cleaning gas containing fluorine;
means for heating an inner part of said process chamber to a temperature of from room temperature to 250° C., so that the cleaning gas introduced into the process chamber cleans at least one of a metal and a metal compound adhering to the inner part of said process chamber due to said process;
after-treatment gas supply means for supplying a cleaning after-treatment gas containing an alcohol into said process chamber and
means for discharging the cleaning gas, the cleaning after-treatment gas and a reaction product of the cleaning gas and cleaning the after-treatment gas.

16. The apparatus according to claim 15, wherein said cleaning gas contains one of chlorine trifluoride and nitrogen trifluoride.

17. The apparatus according to claim 15, wherein said alcohol is isopropyl alcohol.

18. The apparatus according to claim 15, wherein said film forming means processes a plurality of said substrates one by one.

19. The apparatus according to claim 15, wherein said film forming means processes a plurality of said substrates in a batch manner.

20. The apparatus according to claim 15, wherein said cleaning gas introducing means includes a fluoride gas source.

21. The apparatus according to claim 15, wherein said film forming means includes heating means.

22. The apparatus according to claim 21, wherein said heating means includes a resistance exothermic element.

23. The apparatus according to claim 21, wherein said heating means includes a heating lamp.

24. The apparatus according to claim 15, wherein said cleaning gas introducing means includes a nitrogen gas source for introducing nitrogen gas into said process chamber.

25. The apparatus according to claim 24, wherein said cleaning gas introducing means includes an inert gas source for introducing an inert gas into said process chamber.

26. A dry cleaning method for cleaning a process apparatus for processing a substrate contained in a process chamber, said method comprising the steps of:
introducing a cleaning gas containing nitrogen trichloride into said process chamber after the processing;
reacting said cleaning gas with one of a metal and a metal compound adhering to an inner part of said process chamber due to the processing while heating the inner part of said process chamber to a temperature of from room temperature to 250° C.;
supplying a cleaning after-treatment gas containing an alcohol into said process chamber; and
discharging the cleaning gas, the cleaning after-treatment gas and a reaction product of the cleaning gas and cleaning the after-treatment gas.

27. The dry cleaning method according to claim 26, wherein said alcohol is isopropyl alcohol.

28. The dry cleaning method according to claim 26, wherein said one of metal and metal compound is one selected from among the group consisting of titanium, tungsten, tantalum, aluminum, titanium nitride, tungsten nitride, and tantalum nitride.

29. The dry cleaning method according to claim 26, wherein said cleaning gas contains nitrogen gas.

30. The dry cleaning method according to claim 29, wherein said cleaning gas contains an inert gas.

31. A dry cleaning method for cleaning an apparatus for processing a substrate contained in a process chamber, said method comprising the steps of:
introducing a cleaning gas containing fluorine into said process chamber after the processing;
reacting said cleaning gas with a metal or a metal compound adhering to an inner part of said process chamber due to the processing while heating the inner part of said process chamber to a temperature of from room temperature to 250° C.;
performing an after-treatment for supplying a cleaning after-treatment gas containing an alcohol into said process chamber;
discharging the cleaning gas, the cleaning after-treatment gas and a reaction product of the cleaning gas and cleaning the after-treatment gas.

32. The dry cleaning method according to claim 31, wherein said cleaning gas contains one of chlorine trifluoride and nitrogen trifluoride.

33. The dry cleaning method according to claim 31, wherein said alcohol is isopropyl alcohol.

34. The dry cleaning method according to claim 31, wherein said one of metal and metal compound is one selected from among the group consisting of titanium, tungsten, tantalum, aluminum, titanium nitride, tungsten nitride, and tantalum nitride.

35. The dry cleaning method according to claim 31, wherein said cleaning gas contains nitrogen gas.

36. The dry cleaning method according to claim 35, wherein said cleaning gas contains an inert gas.

37. A cleaning apparatus, comprising:
a process chamber for containing a substrate to be processed;
process gas introducing means for introducing into said process chamber a process gas for processing said substrate;
cleaning gas introducing means for introducing into said process chamber a cleaning gas containing nitrogen trichloride or nitrogen fluoride for cleaning at least one of a metal and a metal compound adhering to the inner part of said process chamber due to said process, while maintaining the inner part at room temperature;
heating means for heating an inner part of said process chamber to a temperature of from room temperature to 250° C., so that the cleaning gas introduced into the process chamber cleans at least one of a metal and metal compound adhering to the inner part of said process chamber due to said process;
after-treatment gas supply means for supplying a cleaning after-treatment gas containing an alcohol into said process chamber; and
means for discharging the cleaning gas, the cleaning after-treatment gas and a reaction product of the cleaning gas and for cleaning the after-treatment gas.

38. A dry cleaning apparatus, comprising:
a process chamber for containing a substrate to be processed;
a process gas introducing mechanism introducing into said process chamber a process gas for processing said substrate;
a mechanism for processing said substrate;
a cleaning gas introducing mechanism introducing into said process chamber a cleaning gas containing nitrogen trichloride;
a heater heating an inner part of said process chamber to a temperature of from room temperature to 250° C. so that the cleaning gas introduced in the process chamber cleans at least one of a metal and a metal compound adhering to the inner part of said process chamber due to said process;
an after-treatment gas supply supplying a cleaning after-treatment gas containing an alcohol into said process chamber; and
a discharging mechanism discharging the cleaning gas, the cleaning-after treatment gas and a reaction product of the cleaning gas and cleaning the after-treatment gas.

39. The apparatus according to claim 38, wherein said process chamber includes a peripheral wall having an inner part, in which said heater is provided.

40. The apparatus according to claim 38, which further includes a mechanism reducing pressure in the process chamber to 0.1 to 10 Torr, while the after-treatment gas is supplied into the process chamber by said after-treatment gas supply.

41. A film forming apparatus, comprising:
a process chamber for containing a substrate to be processed;
a process gas introducing mechanism introducing into said process chamber, a process gas for forming one of a metal film and a metal compound film on said substrate;

a film forming mechanism depositing a component of said process gas on said substrate, thereby forming a film;
a cleaning gas introducing mechanism introducing into said process chamber a cleaning gas containing nitrogen trichloride;
a heater heating an inner part of said process chamber to a temperature of from room temperature to 250° C., so that the cleaning gas introduced in the process chamber cleans at least one of a metal and a metal compound adhering to the inner part of said process chamber due to said process;
an after-treatment gas supply supplying a cleaning after-treatment gas containing an alcohol into said process chamber; and
a discharge mechanism discharging the cleaning gas, the cleaning-after-treatment gas and a reaction product of the cleaning gas and a mechanism cleaning the after-treatment gas.

42. The apparatus according to claim 41, wherein said film forming mechanism processes a plurality of said substrates one by one.

43. The apparatus according to claim 41, wherein said film forming mechanism processes a plurality of said substrates in a batch manner.

44. The apparatus according to claim 41, wherein said cleaning gas introducing mechanism includes a nitrogen trichloride gas source.

45. The apparatus according to claim 41, wherein said film forming mechanism includes a heater.

46. The apparatus according to claim 45, wherein said heating mechanism includes a resistance exothermic element.

47. The apparatus according to claim 45, wherein said heater includes a heating lamp.

48. The apparatus according to claim 44, wherein said cleaning gas introducing mechanism introduces a nitrogen gas source for introducing nitrogen gas into said process chamber.

49. The apparatus according to claim 48, wherein said cleaning gas introducing mechanism includes an inert gas source introducing an inert gas into said process chamber.

50. A dry cleaning apparatus, comprising:
a process chamber containing a substrate to be processed;
a process gas introducing mechanism introducing into said process chamber a process gas for processing said substrate;
a process mechanism processing said substrate;
a cleaning gas introducing mechanism introducing into said process chamber a cleaning gas containing fluorine;
a heater heating an inner part of said process chamber to a temperature of from room temperature to 250° C., so that the cleaning gas introduced in the process chamber cleans at least one of a metal and a metal compound adhering to the inner part of said process chamber due to said process;
an after-treatment gas supply supplying a cleaning after-treatment gas containing an alcohol into said process chamber; and
a discharge mechanism discharging a cleaning gas, the cleaning after-treatment gas and a reaction product of the cleaning gas and a mechanism cleaning the after-treatment gas.

51. The apparatus according to claim 50, wherein said cleaning gas contains one of chlorine trifluoride and nitrogen trifluoride.

52. A film forming apparatus, comprising:

a process chamber containing a substrate to be processed;

a process gas introducing mechanism introducing into said process chamber a process gas for forming one of a metal film and a metal compound film on said substrate;

a film forming mechanism depositing a component of said process gas on said substrate, thereby forming a film;

a cleaning gas introducing mechanism introducing into said process chamber a cleaning gas containing fluorine;

a heater heating an inner part of said process chamber to a temperature of from room temperature to 250° C., so that the cleaning gas introduced into the process chamber cleans at least one of a metal and a metal compound adhering to the inner part of said process chamber due to said process;

an after-treatment gas supply supplying a cleaning-after treatment gas containing an alcohol into said process chamber; and a discharging mechanism discharging the cleaning gas, the cleaning-after treatment gas and a reaction product of the cleaning gas and a mechanism cleaning the after-treatment gas.

53. The apparatus according to claim 52, wherein said cleaning gas contains one of chlorine trifluoride and nitrogen trifluoride.

54. The apparatus according to claim 52, wherein said alcohol is isopropyl alcohol.

55. The apparatus according to claim 52, wherein said film forming mechanism processes a plurality of said substrates one by one.

56. The apparatus according to claim 52, wherein said film forming mechanism processes a plurality of said substrates in a batch manner.

57. The apparatus according to claim 52, wherein said cleaning gas introducing mechanism includes a fluoride gas source.

58. The apparatus according to claim 52, wherein said cleaning gas introducing mechanism includes a nitrogen gas source introducing nitrogen gas into said process chamber.

59. The apparatus according to claim 58, wherein said cleaning gas introducing mechanism includes an inert gas source introducing an inert gas into said process chamber.

60. The apparatus according to claim 52, wherein said film forming mechanism includes a heater.

61. The apparatus according to claim 60, wherein said heater includes a resistance exothermic element.

62. The apparatus according to claim 60, wherein said heater includes a heating lamp.

63. A cleaning apparatus comprising:

a process chamber containing a substrate to be processed;

a process gas introducing mechanism introducing into said process chamber a process gas for processing said substrate;

a cleaning gas introducing mechanism introducing into said process chamber a cleaning gas containing nitrogen trichloride or nitrogen fluoride for cleaning at least one of a metal and a metal compound adhering to the inner part of said process chamber due to said process, while maintaining the inner part at room temperature;

a heater heating an inner part of said process chamber to a temperature of from room temperature to 250° C., so that the cleaning gas introduced into the process chamber cleans at least one of a metal and metal compound adhering to the inner part of said process chamber due to said process;

an after-treatment gas supply supplying a cleaning after-treatment gas containing an alcohol into said process chamber; and a discharge mechanism discharging the cleaning gas, the cleaning after-treatment gas and a reaction product of the cleaning gas and cleaning the after-treatment gas.

* * * * *